(12) United States Patent
Murayama (10) Patent No.: US 8,046,911 B2
(45) Date of Patent: Nov. 1, 2011

(54) METHOD FOR MOUNTING ELECTRONIC COMPONENT ON SUBSTRATE AND METHOD FOR FORMING SOLDER SURFACE

(75) Inventor: Kei Murayama, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 1041 days.

(21) Appl. No.: 11/924,013

(22) Filed: Oct. 25, 2007

(65) Prior Publication Data
US 2008/0099535 A1    May 1, 2008

(30) Foreign Application Priority Data

Oct. 27, 2006  (JP) ................. 2006-292971

(51) Int. Cl.
*H05K 3/34*    (2006.01)

(52) U.S. Cl. ........ 29/840; 29/832; 228/180.21; 438/613

(58) Field of Classification Search .............. 29/830, 29/832, 840; 228/180.21; 257/737, 738, 257/779; 438/612, 613
See application file for complete search history.

(56) References Cited

U.S. PATENT DOCUMENTS 6,153,940 A * 11/2000 Zakel et al. ................. 257/779
6,424,037 B1 * 7/2002 Ho et al. ...................... 257/738
6,902,098 B2 * 6/2005 Dautartas .............. 228/180.21

FOREIGN PATENT DOCUMENTS

JP    2006-035310    2/2006

* cited by examiner

*Primary Examiner* — Donghai D. Nguyen
(74) *Attorney, Agent, or Firm* — Rankin, Hill & Clark LLP (57) ABSTRACT

A method for mounting an electronic component on a substrate includes: forming an Au bump (24) on a surface of an electrode (20) of a substrate (10); placing an Sn-based solder sheet (26) on the Au bump; subjecting the Sn-based solder sheet and the Au bump to reflow soldering, to thus form an Au—Sn eutectic alloy (28); smoothing the eutectic alloy; and bonding an electronic component (30) on a surface of the smoothed eutectic alloy.

11 Claims, 5 Drawing Sheets

METHOD FOR MOUNTING ELECTRONIC COMPONENT ON SUBSTRATE AND METHOD FOR FORMING SOLDER SURFACE

BACKGROUND OF THE INVENTION

The present invention relates to a structure for mounting electronic components on a substrate by means of soldering, and more particularly to a method for mounting electronic components on a substrate through use of an Au—Sn eutectic alloy surface. The present invention also relates to a method for forming a solder surface appropriate as a surface on which electronic components, or the like, are to be mounted. The present invention can be utilized for electronic components of every description in which electronic components are mounted on a substrate by means of soldering; for example, a silicon interposer, an LED, optical components, and the like.

Solder containing Pb or Sn as the principal ingredient has hitherto been used as a joining material for mounting electronic components on a substrate. A lead-free solder alloy is also used. Conventionally, when electronic components are soldered onto a substrate through use of lead-free solder, electrode areas on the substrate are plated with gold (Au) or tin (Sn). Alternatively, a solder pellet made of an Au—Sn alloy has hitherto been used.

Figure 1A:
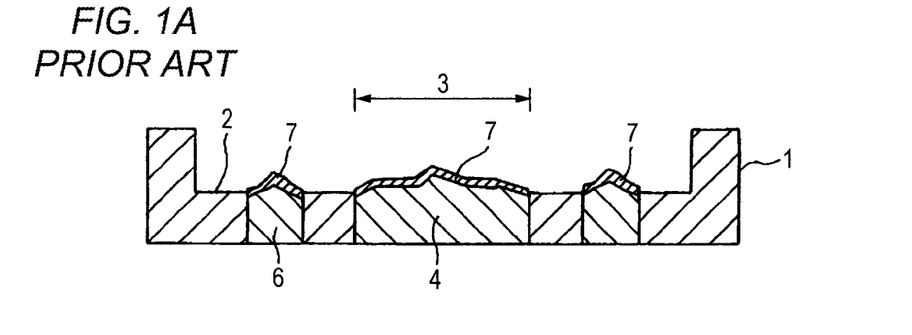
FIGS. 1A to 1C show a related-art method for mounting an electronic component on a silicon substrate.
Figure 1B:
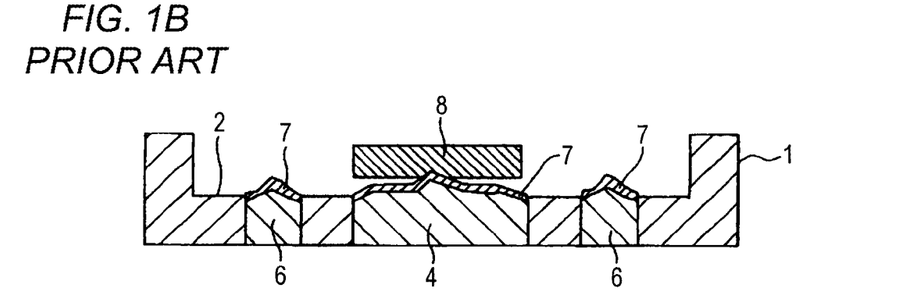
Figure 1C:
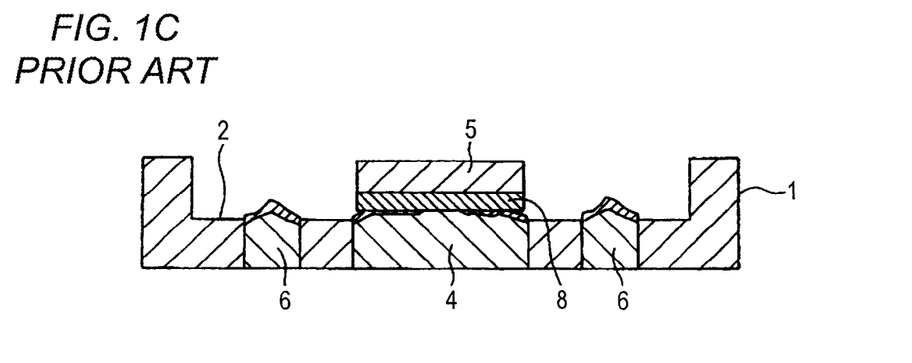

FIG. 1 shows an example related-art technique for mounting electronic components onto a substrate by means of soldering; namely, a case where a semiconductor chip is mounted on a substrate stage electrode with a cavity. In FIG. 1, reference numeral 1 designates an essentially-rectangular silicon substrate with a cavity. The substrate assumes such a shape that the center of the substrate is formed into a recessed cavity area 2 and that a frame-shaped projection is provided along edges of the cavity area. The center portion of the cavity area 2 is a semiconductor chip mount area 3. A stage electrode 4 is formed from copper in this area. A plurality of terminal electrodes 6 to be connected to a mounted semiconductor chip 5 by means of bonding wires (not shown), or the like, are formed from copper at predetermined intervals around the semiconductor chip mount section 3 in the cavity area 2. Rear surfaces of the terminal electrodes are formed as external connection terminals.

In order to mount the electronic component 5 on such a silicon substrate 1 with a cavity, mounting has hitherto been practiced according to the following method.

In FIG. 1A, the silicon substrate is subjected to drilling, or like processing, and the thus-processed substrate is etched so as to assume the shape of the cavity 2 having a recess in the center thereof. Holes are subjected to through-hole plating, or the like, to thus form the stage electrode 4 in the center of the cavity 2 and the plurality of terminal electrodes 6 around the electrode. Since the silicon substrate assumes the shape of a cavity, an interior surface of the recess cannot be smoothed well. As illustrated in an exaggerated manner, the surface of the stage electrode 4 and the surfaces of the terminal electrodes 6 assume an irregular shape.

The surface of the stage electrode 4 located in the center and the surfaces of the terminal electrodes 6 located around the stage electrode are coated with gold (Au) plating 7, respectively. Thus, coating the surface of the stage electrode 4 and the surfaces of the terminal electrodes 6 with the gold plating 7 is for the purpose of enhancing the adhesion between the semiconductor chip 5 and the stage electrode 4 and a joining between the terminal electrodes 6 and bonding wires (not shown).

In FIG. 1B, an Au—Sn solder pellet 8 is affixed to the stage electrode 4 coated with the gold (Au) plating 7. This Au—Sn solder pellet 8 is intended for enhancing a joining between the semiconductor chip 5 to be mounted and the stage electrode 4.

In FIG. 1C, the semiconductor chip 5 is mounted on the stage electrode 4 of the silicon substrate 1 by means of the Au—Sn solder pellet 8. Mounting of this semiconductor chip 5 is performed by means of reflow processing or by means of simultaneous heating of the semiconductor chip 5 and the electrode 4.

Subsequently, electrodes of the semiconductor chip 5 mounted on the silicon substrate 1 and the terminal electrodes 6 are connected together by means of bonding wires (not shown).

A related-art technique relevant to the present invention is described in JP-A-2006-35310. This related-art technique is intended for acquiring a lead-free solder alloy which is not susceptible to an adverse effect induced by reflow processing even when lead-free solder having a comparatively-high melting point is used as solder for mounting electronic components on a substrate and which can be preferably used in die bonding operation for bonding the inside of the electronic components. The lead-free solder contains 10 to 24.9 mass percents of Cu, 5 mass percents or more of Sb, and a residue made of Sn. The Sn content exceeds 70 mass percents. JP-A-2006-35310 also discloses that the solder is caused to contain a predetermined amount of one kind of element or more kinds of elements selected from the group comprising Ag, Au, and Pd along with Cu and that addition of Te to solder and addition of P or Ge are also preferable.

JP-A-2006-35310

As in the case of the related-art technique shown in FIG. 1, difficulty is encountered in manipulating a tool, such as a polishing jig, or the like, with regard to an interior surface of a cavity as in a silicon substrate with a cavity. When electronic components (semiconductor chips) are mounted on a stage electrode whose interior surface is difficult to smooth or on a substrate stage electrode having terminal electrodes, difficulty is encountered in smoothing a surface of the stage electrode or surfaces of the terminal electrodes. Hence, smoothing of the surfaces becomes insufficient, and there arises a problem of occurrence of poor adhesion between the mounted electronic components and the stage electrode. Solving these problems also produces another problem of a necessity for expensive means to smooth a semiconductor chip mount surface, such as plating of the stage electrode or the terminal electrodes with gold or use of an Au—Sn solder pellet for the stage electrode.

Even in relation to the lead-free solder alloy disclosed in the previously-described related-art technique (JP-A-2006-35310), electronic components cannot be mounted on a substrate whose surface is difficult to smooth, as in the case of the previously-described silicon substrate with a cavity, with superior adhesion.

Accordingly, the challenge to be met by the present invention is to provide a method for forming a solder surface which can be appropriately provided in a case where electronic components are mounted on a solder surface of a substrate, or the like, and which enables inexpensive formation of a smoothed solder surface formed from an Au—Sn eutectic alloy.

Moreover, the challenge to be met by the present invention is to provide a method for mounting electronic components on a substrate which enables appropriate mounting of electronic components by means of smoothing surfaces of stage electrodes onto which the electronic components are to be mounted respectively.

SUMMARY OF THE INVENTION

In order to solve the problems, according to a first aspect of the invention, there is provided with a method for forming a solder surface including the steps of:

forming an Au bump on a surface of an electrode of a substrate;

placing an Sn-based solder sheet on the Au bump;

subjecting the Sn-based solder sheet and the Au bump to reflow soldering to form an Au—Sn eutectic alloy; and smoothing the eutectic alloy.

Thus, according to the present invention, after an Au bump has been formed on the surface of an electrode of a substrate, an Au—Sn eutectic alloy is formed from the Au bump and an Sn-based solder sheet. Since the alloy is smoothed, a smooth solder surface can be formed inexpensively.

According to a second aspect of the invention, there is provided with the method for forming a solder surface, wherein one or a plurality of Au bumps are formed on respective surfaces of a plurality of electrodes on the substrate;

one Sn-based solder sheet is placed so as to come into contact with the plurality of Au bumps, respectively; and the Sn-based solder sheet and the plurality of Au bumps are subjected to reflow soldering to form an Au—Sn eutectic alloy.

In this case, a mass of Au—Sn eutectic alloy is formed between the plurality of Au bumps and the single Sn-based solder sheet. Hence, the Au—Sn eutectic alloy is bonded to the respective electrode surfaces. Further, since the eutectic alloy is smoothed, a smooth solder surface can be formed inexpensively.

Further, according to a third aspect of the invention, there is provided with a method for forming a solder surface, including the steps of:

forming an Au bump on a surface of an electrode of a substrate;

applying a plurality of Sn-based solder balls to the Au bumps;

subjecting the Sn-based solder balls and the Au bumps to reflow soldering to form an Au—Sn eutectic alloy; and smoothing the eutectic alloy.

In this case, after an Au bump has been formed on the surface of an electrode of a substrate, an Au—Sn eutectic alloy is formed from the Au bump and an Sn-based solder sheet. Since the alloy is smoothed, a smooth solder surface can be formed inexpensively.

According to a forth aspect of the invention, there is provided with the method for forming a solder surface, wherein one or a plurality of Au bumps are formed on respective surfaces of a plurality of electrodes on the substrate; and the Sn-based solder balls are applied, by way of pores of a placement mask, to an area where the plurality of Au bumps are formed, through use of the placement mask having the plurality of pores of which size enables passage of the respective Sn-based solder balls.

According to a fifth aspect of the invention, there is provided with the method for forming a solder surface, wherein the Au bumps are formed by means of a bonder.

In this case, a wire bonder used in ordinary wire bonding operation can be used as the bonder. As a result, Au bumps can be formed readily and inexpensively.

According to a sixth aspect of the invention, there is provided with a method for mounting an electronic component on a substrate including the steps of:

forming an Au bump on a surface of an electrode of a substrate;

placing an Sn-based solder sheet on the Au bump;

subjecting the Sn-based solder sheet and the Au bump to reflow soldering to form an Au—Sn eutectic alloy;

smoothing the eutectic alloy; and bonding an electronic component on a surface of the smoothed eutectic alloy.

In this case, after an Au bump has been formed on the surface of an electrode of a substrate, an Au—Sn eutectic alloy is formed from the Au bump and an Sn-based solder sheet. After the eutectic alloy has been smoothed, the electronic component is mounted on the smooth surface, and hence adhesion between the electrode surfaces and the electronic component can be made superior.

According to a seventh aspect of the invention, there is provided with the method for mounting an electronic component on a substrate, wherein a stage electrode used for mounting an electronic component is formed from surfaces of a plurality of electrodes;

one or a plurality of Au bumps are formed on the respective electrode surfaces;

one Sn-based solder sheet is placed so as to come into contact with the plurality of Au bumps, respectively; and subjecting the Sn-based solder sheet and the plurality of Au bumps to reflow soldering to form an Au—Sn eutectic alloy.

In this case, a mass of Au—Sn eutectic alloy is formed between the plurality of Au bumps and the single Sn-based solder sheet.

The Au—Sn eutectic alloy is bonded to the respective electrode surfaces, and the eutectic alloy is smoothed. Therefore, a smooth solder surface can be formed inexpensively.

Further, according to an eighth aspect of the invention, there is provided with a method for mounting an electronic component on a substrate including the steps of:

forming an Au bump on a surface of an electrode of a substrate;

applying a plurality of Sn-based solder balls to the Au bumps;

subjecting the Sn-based solder balls and the Au bumps to reflow soldering to form an Au—Sn eutectic alloy;

smoothing the eutectic alloy; and bonding an electronic component to a surface of the smoothed eutectic alloy.

In the present invention, after an Au bump has been formed on the surface of an electrode of a substrate, an Au—Sn eutectic alloy is formed from the Au bump and an Sn-based solder sheet. After the eutectic alloy has been smoothed, the electronic component is mounted on the smooth surface, and hence adhesion between the electrode surfaces and the electronic component can be made superior.

Further, according to a ninth aspect of the invention, there is provided with the method for mounting an electronic component on a substrate, wherein a stage electrode used for mounting an electronic component is formed from surfaces of a plurality of electrodes;

one or a plurality of Au bumps are formed on the respective electrode surfaces; and the Sn-based solder balls can be applied, by way of pores of a placement mask, to an area where the plurality of Au bumps are formed, through use of the placement mask having the plurality of pores of which size enables passage of the respective Sn-based solder balls.

According to a tenth aspect of the invention, there is provided with the method for mounting an electronic component on a substrate, wherein the substrate is a silicon substrate with a cavity in which a circumferential portion of the substrate is formed into a frame and in which the electrode surface is formed in a center recess;

the stage electrode used for mounting an electronic component is formed in a center within the recess;

a plurality of electrodes are formed around the stage electrode within the recess; and the electronic component and the plurality of terminal electrodes are subjected to wire bonding after bonding the electronic component onto a surface of the eutectic alloy.

As a result, even when an electronic component is mounted on electrodes whose surface are difficult to smooth, as in the case of a silicon substrate with a cavity, smoothing of electrode surfaces can be ensured by means of an inexpensive method, and adhesion between the electrode surfaces and the electronic component can be made superior.

DETAILED DESCRIPTION OF THE PREFERRED EMBODIMENTS

An embodiment of the present invention will be described hereinbelow by reference to the accompanying drawings.

FIGS. 2 and 3 are views for describing, in process sequence, a method for mounting electronic components according to an embodiment of the present invention. FIGS. 2A to 2F show the first half of processes, and FIGS. 3A to 3E show the latter half of the processes.

Figure 2A:
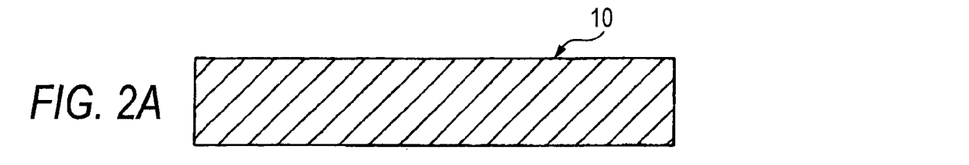
FIGS. 2A to 2F show a first half of processes of a method for mounting electronic components on the silicon substrate of the present invention.
Figure 2B:
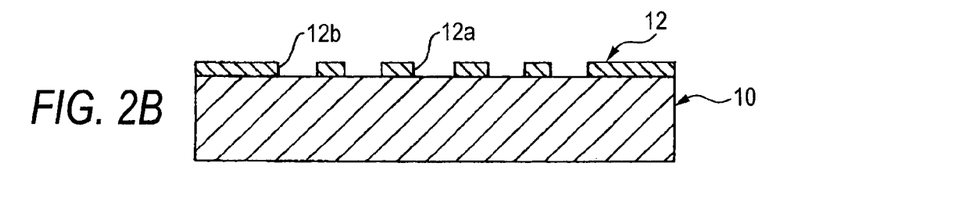

In FIG. 2A, a silicon wafer 10 of predetermined thickness for forming a substrate with a cavity. In FIG. 2B, primary resist 12 is applied over the silicon wafer 10, and the thus-applied resist is patterned. By means of this patterning operation, openings 12a and 12b are formed in areas on the resist 12 which are to be subjected to drilling in the next process. These openings 12a and 12b correspond to a plurality of areas (12a) where stage electrodes used for mounting electronic components are to be formed and a plurality of areas (12b) where terminal electrodes subjected to wire bonding are to be formed.

Figure 2C:
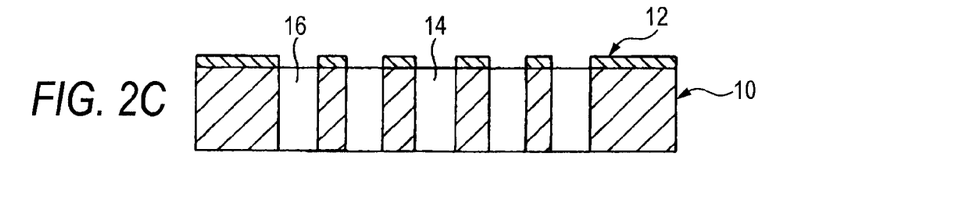

In FIG. 2C, primary drilling is performed. Performing drilling operation by means of dry etching or wet etching is preferable. When necessary, anisotropic etching for regulating a starting point and an end point for drilling operation is carried out in such a way that created forms become tapered. Thus, holes 14 and 16 corresponding to the openings 12a and 12b of the resist 12 are created. The plurality of holes 14 located in the center correspond to areas where stage electrodes are to be formed, and the plurality of areas 16 located in surrounding areas correspond to areas where terminal electrodes are to be formed.

Figure 2D:
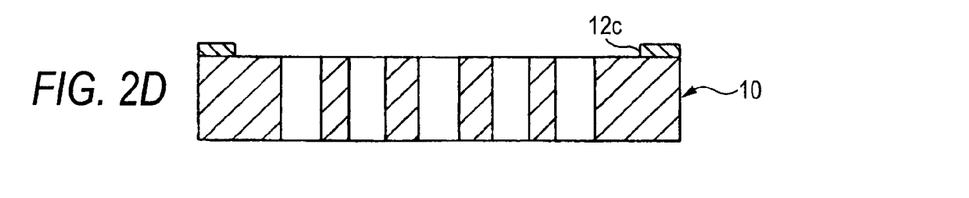

In FIG. 2D, secondary resist 12 is applied over the silicon wafer 10, and the thus-applied resist is patterned. By means of this patterning operation, openings 12c are formed in areas on the resist where a cavity of the substrate is to be created in the next process. The openings 12c include the areas which have been drilled in the previous process and where the stage electrodes are to be formed and the areas where the terminal electrodes are to be formed. Further, the openings 12c correspond to a rectangular frame left around an outer peripheral area of the substrate or an inner area of a dam.

Figure 2E:
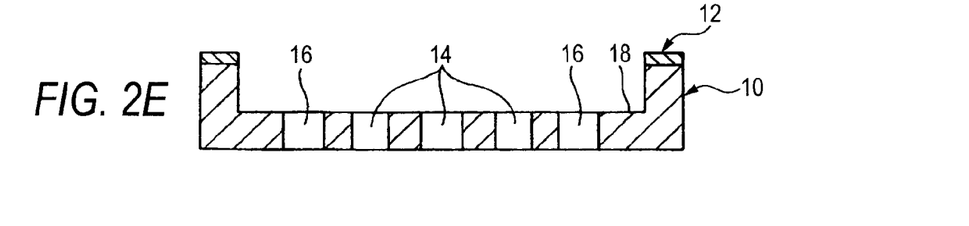

In FIG. 2E, a secondary drilling operation for creating a cavity is carried out. As in the case of the primary drilling operation, the secondary drilling operation is performed by means of dry etching or wet etching. Thereby, a cavity 18 is formed in the center of the substrate. The plurality of holes 14 used for forming stage electrodes are left in the center of an interior area of the cavity 18. The plurality of holes 16 used for forming terminal electrodes are left in surrounding areas. An inside of the cavity 18 is; for example, a square measuring about 1.8 mm per side, and an outside of the substrate is; for example, a square measuring about 2.5 mm per side.

Figure 2F:
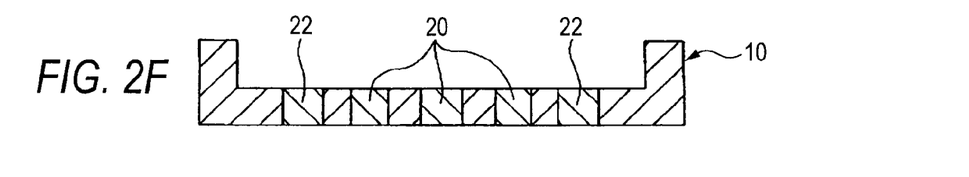

In FIG. 2F, after removal of a residual resist, an oxide film is formed on the surface of the silicon substrate 10, and through electrodes 20 (stage electrodes) and 22 are formed in the respective holes 14 and 16 located within the cavity 18. These through electrodes 20 (stage electrodes) and 22 can be formed form copper by means of through-hole electrolytic plating, or the like. The plurality of through electrodes 22 located in the center correspond to stage electrodes where electronic components are to be mounted respectively, and the plurality of through electrodes 22 located in the surrounding areas correspond to terminal electrodes to be connected through wire bonding.

Figure 3A:
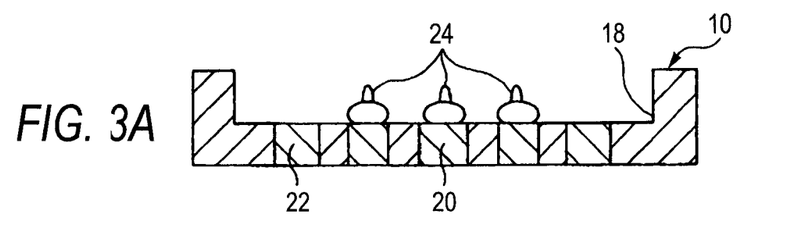
FIGS. 3A to 3E show a subsequent process of the method for mounting electronic components on a silicon substrate of the present invention.

In FIG. 3A, gold (Au) bumps 24 are formed on the plurality of respective stage electrodes 20 in the center area. The Au bumps 24 can be formed by means of a ponder (not shown) used for wire bonding. Specifically, immediately after a gold (Au) wire has been output from the extremity of the ponder and brought into contact with the stage electrode 20, the extremity of the ponder is separated from the stage electrode 20, and the wire is cut. As illustrated, a bottom of the stud-shaped Au bump 24 remaining in contact with the stage electrode 20 becomes swelled, and an upper end of the Au bump 24 is pointed. The Au bump 24 is formed on all of the stage electrodes 20 located within the area where electronic components (not shown) are mounted.

In this case, the plurality of Au bumps 24 may also be formed for one stage electrode 20 located in the center. Alternatively, one or a plurality of Au bumps 24 may also be formed for the plurality of stage electrodes 20, respectively.

Figure 3B:
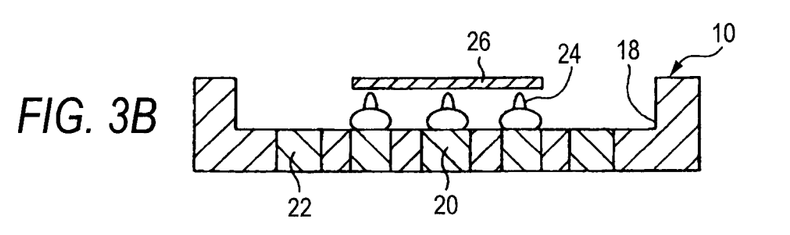

In FIG. 3B, a plate-shaped Sn-based solder sheet 26 equal to the size of an electronic component mount area (e.g. a square measuring about 1.0 mm per side) of the stage electrode 20 is placed on the electronic component mount area. The solder sheet 26 is formed from an Sn-based solder pellet into the shape of a sheet. An Sn—Au-based solder sheet, an Sn—Ag-based solder sheet, or an Sn—Ag—Cu-based solder sheet may also be used in place of the Sn-based solder sheet 26.

Figure 3C:
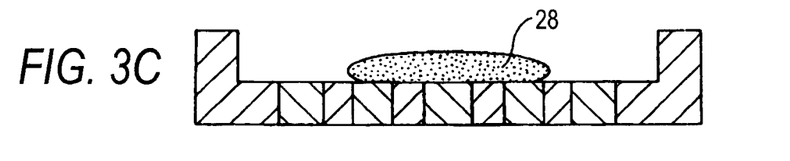

In FIG. 3C, reflow soldering is performed by means of a heating oven. As a result, an Sn—Au-based solder eutectic alloy 28 including the Sn-based solder sheet 26 and the stud-shaped Au bumps 24 is formed on the electronic component mount area.

Figure 3D:
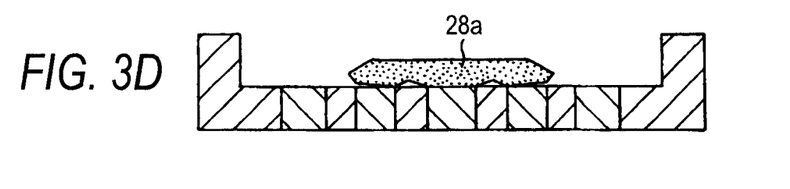

In FIG. 3D, the layer of the eutectic alloy 28 is smoothed. During smoothing operation, the eutectic alloy 28 is usually struck from above at a temperature of 200° C. to 250° C. by means of coining through use of a jig (not shown) having a smooth surface, whereupon the upper surface of the eutectic alloy 28 is smoothed.

Figure 3E:
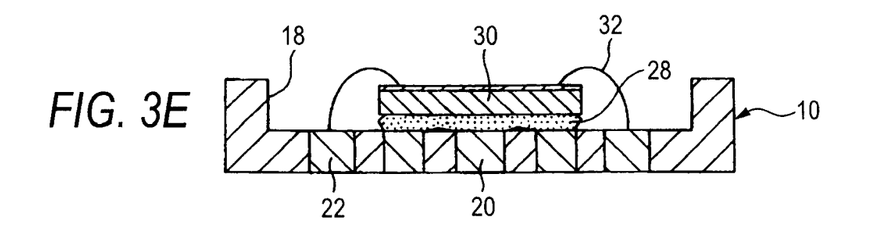
Figure 4A:
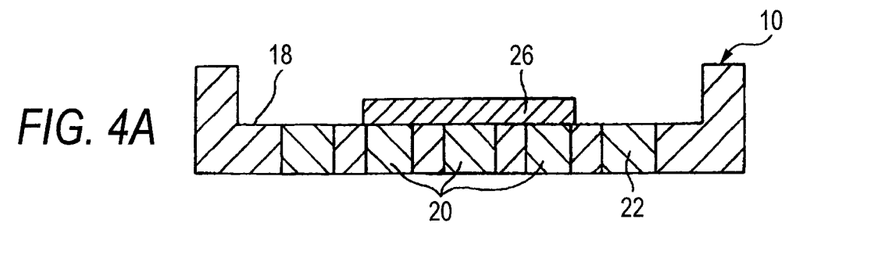
FIGS. 4A to 4D show a method for forming a solder surface by use of an Au—Sn solder sheet.
Figure 4B:
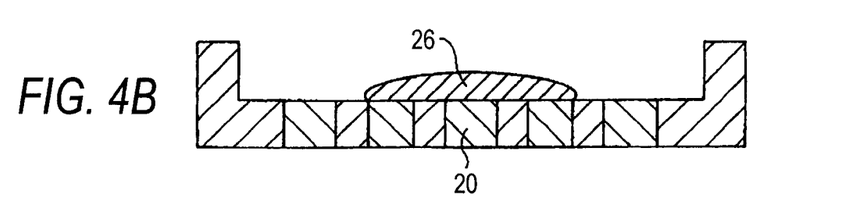
Figure 4C:
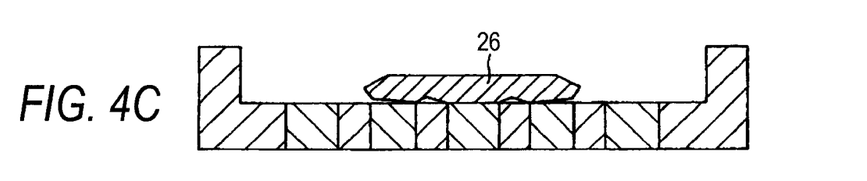
Figure 4D:
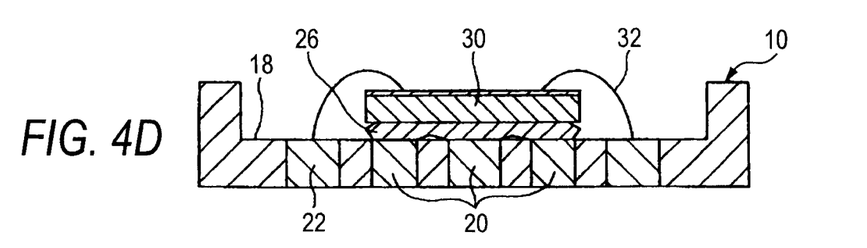

In FIG. 3E, the electronic component 30 is mounted on the upper surface of the eutectic alloy 28, and electrodes on the upper surface of the electronic component 30 and the terminal electrodes 22 on the silicon substrate area electrically connected together by means of bonding wires 32.

In the embodiment of the present invention, such as that mentioned above, a composition of 99.99% (4N) to 99.9999% (6N) Au is used for a gold wire employed for the case of formation of the Au bumps 24. An Sn-based solder material employed in this case is; for example, Sn3.5Ag (96.5 mass percents of Sn and 3.5 mass percents of Ag), Sn3.0Ag0.5Cu (96.5 mass percents of Sn, 3.0 mass percents of Ag, and 0.5 mass percents of Cu), Sn9Zn (91.0 mass percents of Sn and 9.0 mass percents of Zn), Sn8Zn1Bi (91.0 mass percents of Sn, 8.0 mass percents of Zn, and 1.0 mass percents of Bi), and the like.

For instance, when 80 mg of; e.g., an Au wire (line) is used, 20.73 mg of Sn3.5Ag is assumed to have been used. At that time, the ratio of Au to Sn approximates to an eutectic composition having a ratio of about 80:20. Moreover, for example, when 80 mg of an Au wire (line), is used, 20.73 mg of Sn3.0Ag0.5Cu is assumed to have been used. The ratio of Au to Sn approximates to an eutectic composition having a ratio of about 80:20.

As mentioned above, the ratio of Au to Sn is adjusted so as to range from 30 mass percents to 90 mass percents.

FIG. 4 shows an example where only the Sn—Au-based solder sheet 26 is used. Specifically, as shown in FIG. 4A, the rectangular Sn—Au-based sheet 26 is mounted on the electronic component mount area of the stage electrode 20 after processes shown in FIGS. 2A to 2F. In FIG. 4B, the sheet 26 is bonded to the stage electrode 20 in a fused manner by means of reflow soldering. Moreover, in FIG. 4C, the surface of the solder sheet 26 is smoothed by means of coining, or the like, and the electronic component 30 is mounted on the solder sheet 26. Electrodes on the upper surface of the electronic component 30 are electrically connected to the terminal electrodes 22 of the silicon substrate 22 by means of the bonding wires 32.

Figure 5:
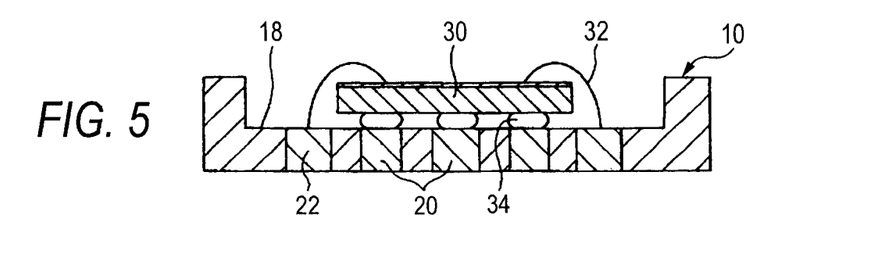
FIG. 5 shows a method for mounting electronic components by means of solder bumps.

FIG. 5 shows an example in which the electronic component 30 is mounted directly onto the stage electrode 20 without use of the solder sheet 26. Specifically, in FIG. 5, the solder bumps 34 are mounted on the plurality of stage electrodes 20 in processes subsequent to the processes shown in FIGS. 2A to 2F. Alternatively, the bumps 34 have been previously attached to positions on the bottom surface of the electronic component 30 corresponding to the stage electrode 20. After the electronic component 30 has been mounted on the stage of the substrate, the substrate is subjected to reflow soldering, whereby the electronic component 30 and the stage electrode 20 are attached together by means of the bumps 34.

FIG. 6 shows another embodiment in which solder balls are used in place of the solder sheet described in connection with the embodiment shown in FIG. 3. Explanations are given solely to a difference between the present embodiment and the embodiment described by reference to FIGS. 2 and 3.

Figure 6A:
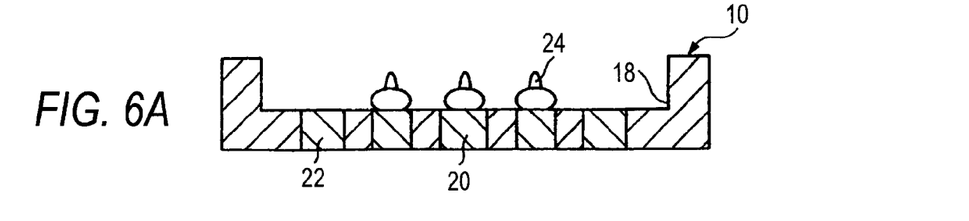
FIGS. 6A to 6F show an embodiment of a case where solder balls are used in place of the solder sheet of the embodiment shown in FIG. 3.

A process shown in FIG. 6A is identical with the process shown in FIG. 3A, and shows that the gold (Au) bumps 24 are formed on the plurality of stage electrodes 20 in the center.

Figure 6B:
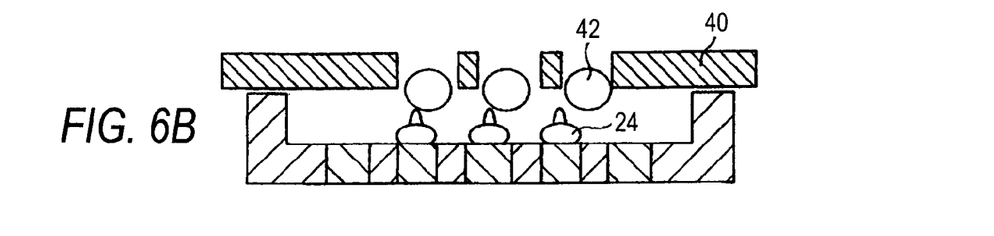
Figure 6C:
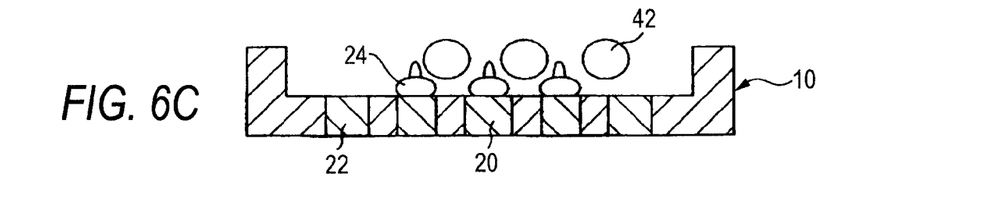

In FIGS. 6B and 6C, by use of a placement mask 40 having a plurality of pores, Sn-based solder balls 42 are applied to, from the above the Au bumps 24 on the electronic component mount area of the stage electrode 20, an area where a plurality of Au bumps 24 are formed; namely, an entirety of an area corresponding to the size of the electronic component mount area (e.g., a square measuring about 1.0 mm per side), through the pores of the placement mask 40.

The pore of the placement mask 40 is provided in numbers over a mask plate; namely, the entirety of an area corresponding to the area where a plurality of Au bumps 24 are to be formed (i.e., the electronic component mount area). Each hole as a diameter which enables passage of the solder ball 42 one at a time. The placement mask 40 is placed, in a positioned manner, on the frame around the silicon substrate 10 in such a way that the area where the solder balls 42 are to be formed coincides with the area where Au bumps 24 are to be formed. A plurality of solder balls 42 are filled on an upper surface of the placement mask 40 such that a predetermined amount of solder balls 42 is entirely achieved. The respective solder balls 42 fall downwardly through the plurality of pores of the placement mask 40. After the solder balls 42 have been applied over the entire area on the silicon substrate 10 where Au bumps 24 are to be formed, the placement mask 40 is removed, and processing proceeds to the next process.

Figure 6D:
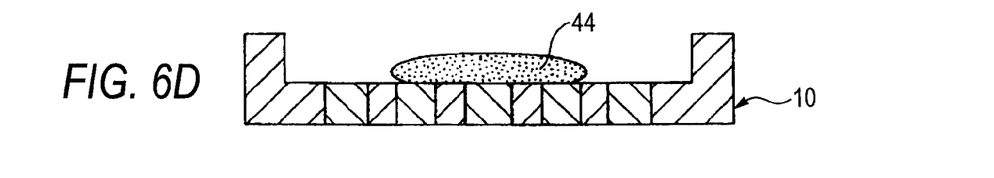

In FIG. 6D, reflow soldering is performed by means of the heating oven. As a result, an Sn—Au-based solder eutectic alloy 44 including the solder balls 42 and the stud-shaped Au bumps 24 is formed on the electronic component mount area. In this case, since the stud-shaped Au bumps 24 have been fixed to the stage electrode 20 before undergoing reflow soldering, when the eutectic solder alloy 44 is formed from the solder balls 42 and the stud-shaped Au bumps 24, the eutectic alloy 44 does not deviate from a predetermined position.

Figure 6E:
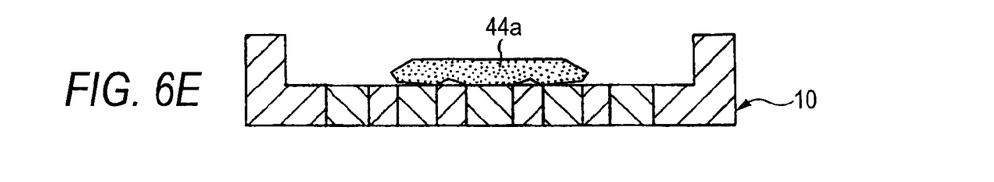

In FIG. 6E, a layer of the eutectic alloy 44 is smoothed in the same manner as in the process shown in FIG. 3D. During smoothing operation, the eutectic alloy 44 is usually struck from above at a temperature of 200° C. to 250° C. by means of coining through use of a jig (not shown) having a smooth surface, whereupon the upper surface of the eutectic alloy 44 is smoothed (44a).

Figure 6F:
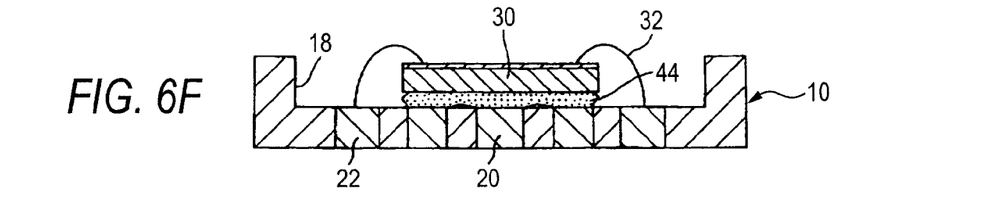

In FIG. 6F, the electronic component 30 is mounted on the upper surface of the eutectic alloy 44 as in the case of the process shown in FIG. 3E, and electrodes on the upper surface of the electronic component 30 and the terminal electrodes 22 on the silicon substrate area electrically connected together by means of bonding wires 32.

Although the embodiments of the present invention have been described by reference to the accompanying drawings, the present invention is not limited to the above embodiments but is susceptible to various modes, alterations, and modifications within the spirit and scope of the present invention.

As described above, according to the present invention, a smooth solder surface, which can be appropriately used for a case where electronic components are mounted on a solder surface of a substrate and which is formed from an Au—Sn eutectic alloy, can be formed inexpensively. When the electronic components are mounted, a solder plane to be bonded is flat, and adhesion between the electronic component and electrodes becomes superior.

What is claimed is:

1. A method for forming a solder surface comprising the steps of:

forming an gold (Au) bump on a surface of an electrode, the electrode being provided in a bottom surface of a cavity that is formed in a silicon substrate, the Au bump is formed by a wire bonder;

placing an Sn-based solder sheet on the Au bump;

subjecting the Sn-based solder sheet and the Au bump to reflow soldering to form an Au—Sn eutectic alloy such that an upper surface of the eutectic alloy is curved; and coining the upper surface of the eutectic alloy by striking with a smooth faced jig such that the upper surface of the eutectic alloy is generally flat.

2. The method for forming a solder surface according to claim 1, wherein one or a plurality of Au bumps are formed on respective surfaces of a plurality of electrodes on the substrate;

one Sn-based solder sheet is placed so as to come into contact with the plurality of Au bumps, respectively; and the Sn-based solder sheet and the plurality of Au bumps are subjected to reflow soldering to form an Au—Sn eutectic alloy;

forming an Au bump on a surface of an electrode of a substrate;

applying a plurality of Sn-based solder balls to the Au bumps;

subjecting the Sn-based solder balls and the Au bumps to reflow soldering to form an Au—Sn eutectic alloy; and smoothing the eutectic alloy.

3. The method for forming a solder surface according to claim 2, wherein an Sn—Au-based solder sheet, an Sn—Ag-based solder sheet, or an Sn—Ag—Cu-based solder sheet is employed for an Sn-based solder sheet.

4. The method for forming a solder surface according to claim 1, wherein an Sn—Au-based solder sheet, an Sn—Ag-based solder sheet, or an Sn—Ag—Cu-based solder sheet is employed for an Sn-based solder sheet.

5. The method for forming a solder surface according to claim 1, wherein material of the Sn-based solder is Sn3.0Ag0.5Cu.

6. A method for mounting an electronic component on a substrate comprising the steps of:

forming an gold (Au) bump on a surface of an electrode, the electrode being provided in a bottom surface of a cavity that is formed in a silicon substrate, the Au bump is formed by a wire bonder;

placing an Sn-based solder sheet on the Au bump;

subjecting the Sn-based solder sheet and the Au bump to reflow soldering to form an Au—Sn eutectic alloy such that an upper surface of the eutectic alloy is curved;

coining the upper surface of the eutectic alloy by striking with a smooth faced jig such that the upper surface of the eutectic alloy is generally flat; and mounting an electronic component to the generally flat upper surface of the eutectic alloy.

7. The method for mounting an electronic component on a substrate according to claim 6, wherein a stage electrode used for mounting an electronic component is formed from surfaces of a plurality of electrodes;

one or a plurality of Au bumps are formed on the respective electrode surfaces;

one Sn-based solder sheet is placed so as to come into contact with the plurality of Au bumps, respectively; and subjecting the Sn-based solder sheet and the plurality of Au bumps to reflow soldering to form an Au—Sn eutectic alloy.

8. The method for mounting an electronic component on a substrate according to claim 7, wherein an Sn—Au-based solder sheet, an Sn—Ag-based solder sheet, or an Sn—Ag—Cu-based solder sheet is employed for an Sn-based solder sheet.

9. The method for mounting an electronic component on a substrate according to claim 6, wherein the substrate is a silicon substrate with a cavity in which a circumferential portion of the substrate is formed into a frame and in which the electrode surface is formed in a center recess;

the stage electrode used for mounting an electronic component is formed in a center within the recess;

a plurality of electrodes are formed around the stage electrode within the recess; and the electronic component and the plurality of terminal electrodes are subjected to wire bonding after bonding the electronic component onto a surface of the eutectic alloy.

10. The method for mounting an electronic component on a substrate according to claim 6, wherein an Sn—Au-based solder sheet, an Sn—Ag-based solder sheet, or an Sn—Ag—Cu-based solder sheet is employed for an Sn-based solder sheet.

11. The method for mounting an electronic component on a substrate according to claim 6, wherein material of the Sn-based solder is Sn3.0Ag0.5Cu.

* * * * *